(12) United States Patent
Winkler et al.

(10) Patent No.: US 8,101,922 B2
(45) Date of Patent: Jan. 24, 2012

(54) MODULAR GAS ION SOURCE

(75) Inventors: Dieter Winkler, Munich (DE); Thomas Jasinski, Munich (DE); Udo Weigel, Munich (DE)

(73) Assignee: ICT Integrated Circuit Testing Gesellschaft für Halbleiterprüftechnik mbH, Heimstetten (DE)

( * ) Notice: Subject to any disclaimer, the term of this patent is extended or adjusted under 35 U.S.C. 154(b) by 634 days.

(21) Appl. No.: 12/167,734

(22) Filed: Jul. 3, 2008

(65) Prior Publication Data

US 2009/0020708 A1    Jan. 22, 2009

(30) Foreign Application Priority Data

Jul. 6, 2007   (EP) ..................... 07013304

(51) Int. Cl.
*H01T 23/00* (2006.01)
(52) U.S. Cl. ............. 250/423 F; 250/424; 250/423 R; 313/231.01; 315/118.81; 315/111.91
(58) Field of Classification Search ............ 250/423 R, 250/424, 423 F; 313/231.01; 315/111.81, 315/111.91
See application file for complete search history.

(56) References Cited

U.S. PATENT DOCUMENTS

| | | | |
|---|---|---|---|
| 4,638,209 A * | 1/1987 | Asamaki et al. | 313/359.1 |
| 7,459,838 B2 * | 12/2008 | Kim et al. | 313/231.31 |
| 2003/0234372 A1 * | 12/2003 | Park | 250/492.21 |
| 2005/0088101 A1 * | 4/2005 | Glidden et al. | 315/111.81 |
| 2008/0283745 A1 * | 11/2008 | Adamec et al. | 250/307 |
| 2009/0057566 A1 * | 3/2009 | Winkler et al. | 250/423 F |
| 2009/0179161 A1 * | 7/2009 | Ward et al. | 250/492.21 |

FOREIGN PATENT DOCUMENTS

| | | |
|---|---|---|
| JP | 57-041247 | 3/1982 |
| JP | 58004252 | 1/1983 |
| JP | 58135544 | 8/1983 |
| JP | 61-206146 | 9/1986 |
| JP | 63-137452 | 6/1988 |
| JP | 63175318 | 7/1988 |
| JP | 63-216251 | 9/1988 |
| JP | 03266336 | 11/1991 |
| WO | WO-2007 067328 | 6/2007 |

OTHER PUBLICATIONS

Wilbertz, et al ("Recent progress in Gas Field Ion Source technology" Proceedings of SPIE vol. 2194, 1994, pp. 407-417; XP008043021).*
Orloff, et al ("Angular intensity of a gas-phase field ionization source" J. Appl. Phys. 50(9) 1979, pp. 6026-6027).*

(Continued)

*Primary Examiner* — Robert Kim
(74) *Attorney, Agent, or Firm* — Patterson & Sheridan, L.L.P.

(57) ABSTRACT

A gas field ion source is described. The gas field ion source includes an emitter module. The emitter module includes an emitter holder, an emitter structure, a detachably connectable electrical connection assembly of the emitter module, and a detachably connectable gas supply connection assembly of the emitter module. The gas field ion source further includes a supply module, wherein the supply module includes an electrical conductor for providing voltage and/or current, a gas supply conduit, a thermal conductor, a detachably connectable electrical connection assembly of the supply module, and a detachably connectable gas supply connection assembly of the supply module. The emitter module and the supply module are detachably connectable by the detachably connectable connection assemblies of the emitter module and the detachably connectable connection assemblies of the supply module.

19 Claims, 4 Drawing Sheets

OTHER PUBLICATIONS

Extended European Search Report, EP 07013304.6, ICT, Integrated Circuit Testing Gesellschaft for Halbleitherprüftechnik mbH, Mar. 19, 2008.

J. Orloff, et al., "Angular Intensity of a Gas-Phase Field Ionization Source," J. Appl. Phys., Sep. 1979, vol. 50, No. 9, XP007903677.

Y. Ochiai, et al. "Fluorine Field Ion Source Using Fluorine-Helium Gas Mixture," 8257a J. Vacuum Science & Tech., Jan./Feb. 1991, No. 1, New York, NY, XP000176203.

Office Action dated Apr. 14, 2011 for Japanese Application 2008-175893.

* cited by examiner

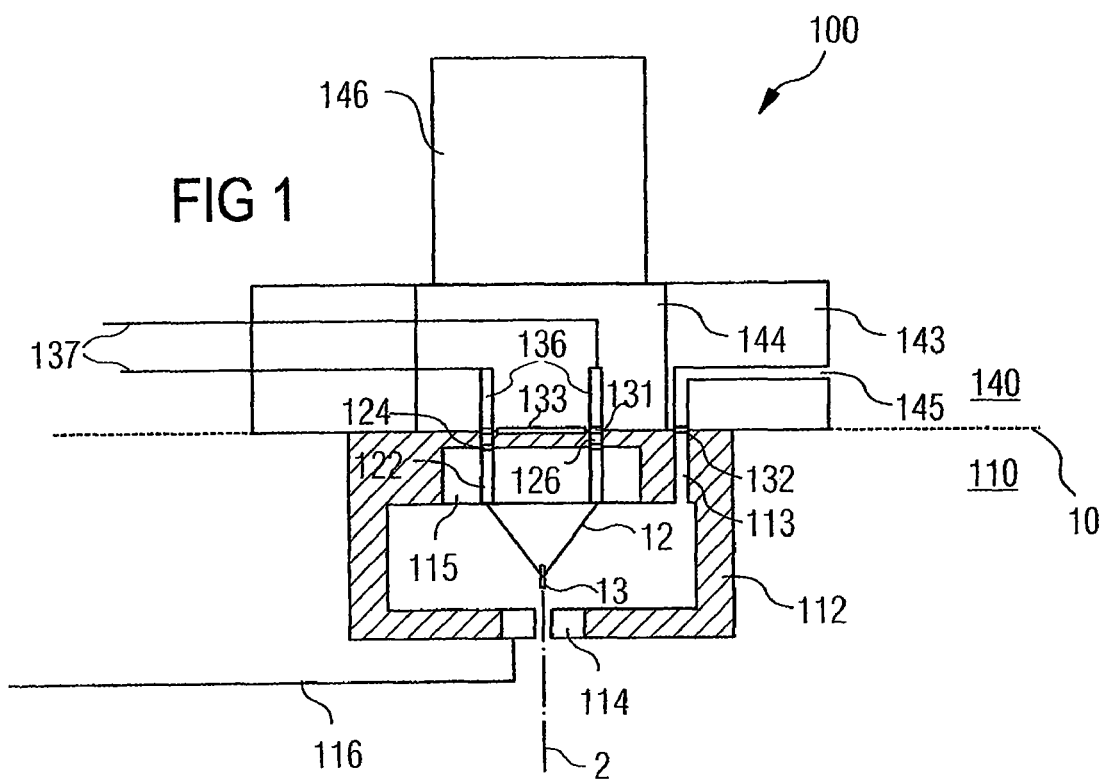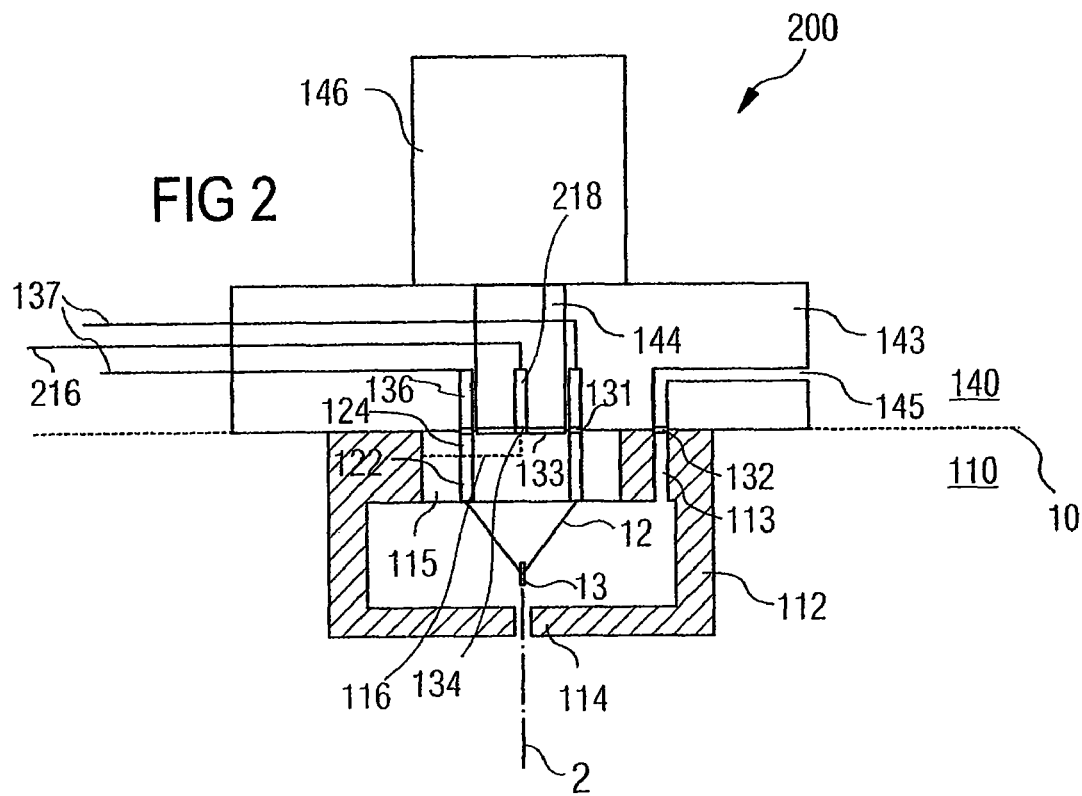

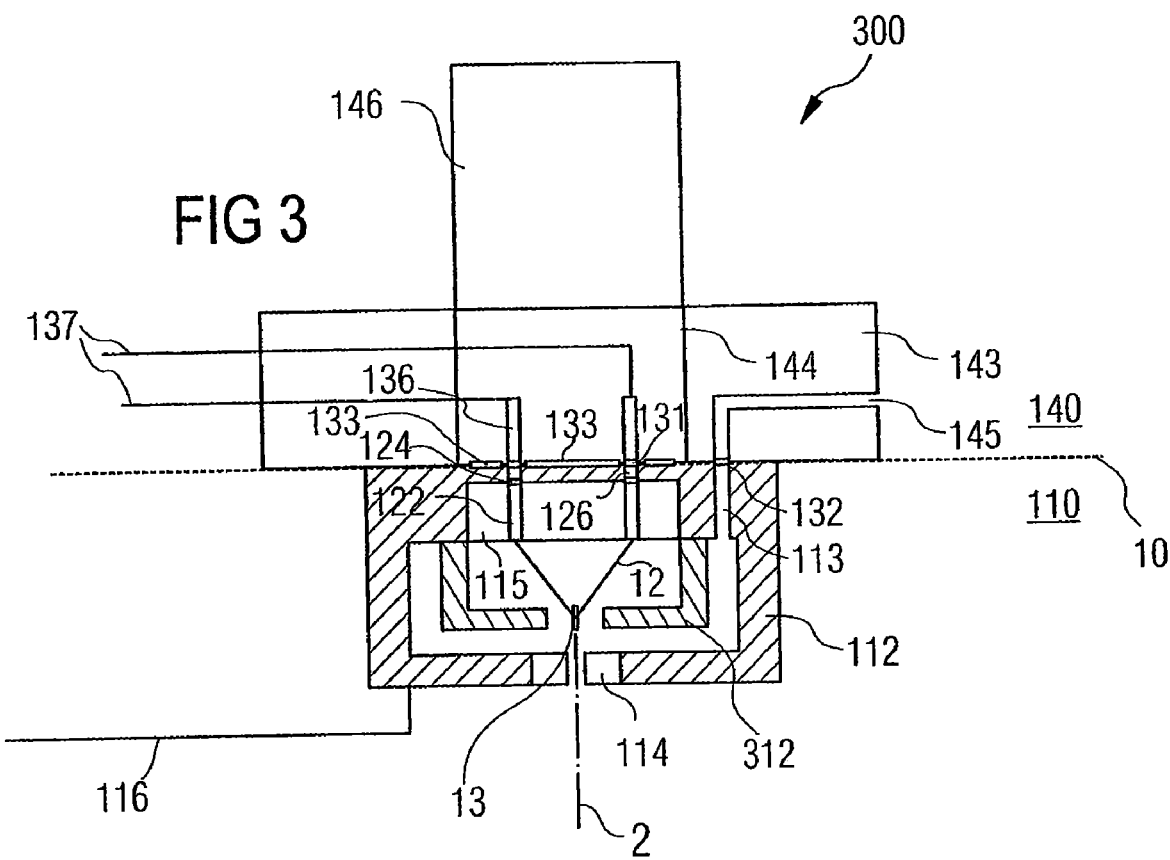

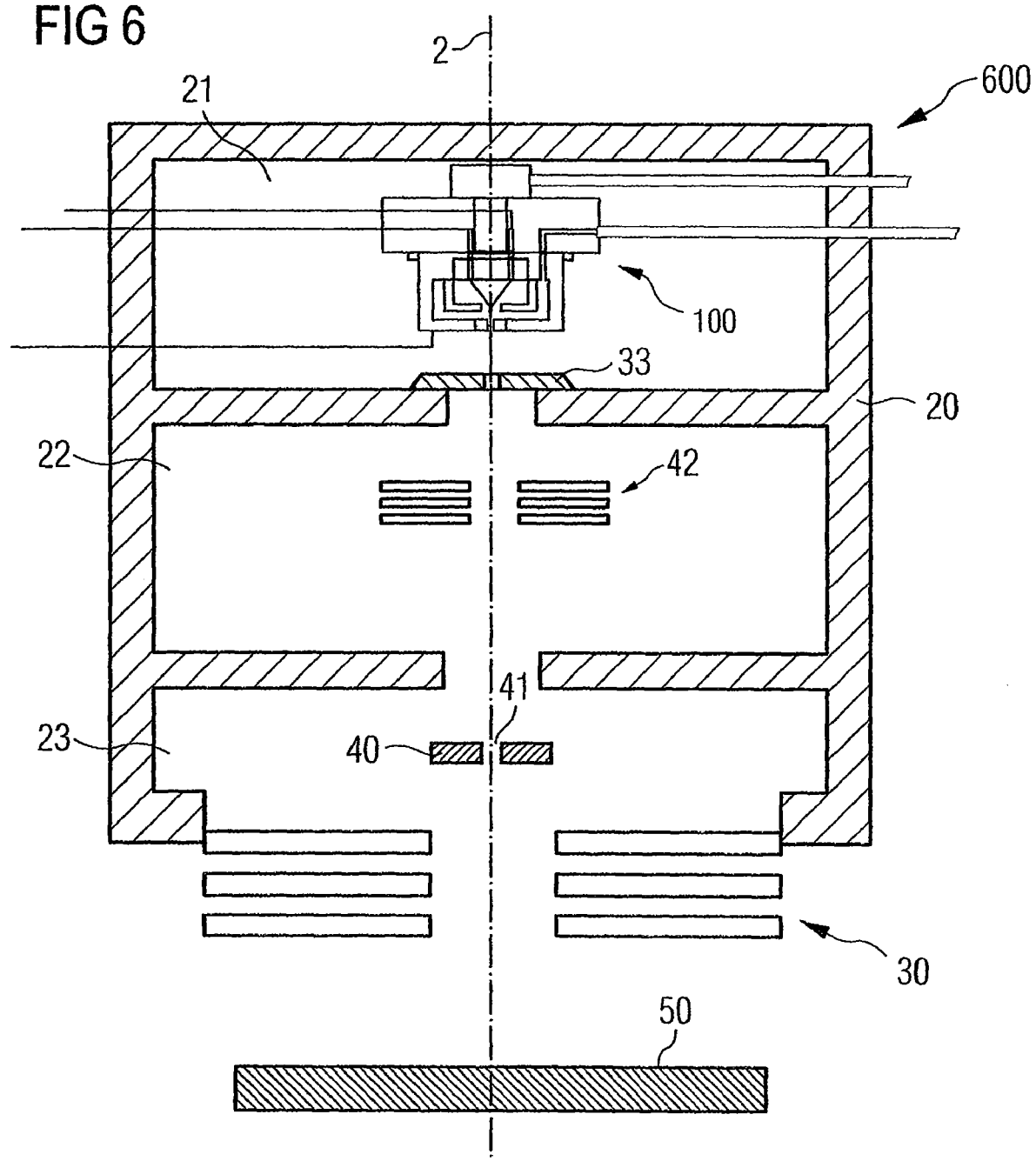

MODULAR GAS ION SOURCE

FIELD OF THE INVENTION

Embodiments described herein generally relate to a charged particle beam device and a method of manufacturing and/or maintaining charged particle beam devices. In particular, the embodiments relate to a gas field ion source of a charged particle beam device. Specifically, it relates to a gas field ion source, a charged particle beam device and a method of maintaining a gas field ion source.

BACKGROUND OF THE INVENTION

Charged particle beam apparatuses have many functions in a plurality of industrial fields, including, but not limited to, inspection of semiconductor devices during manufacturing, exposure systems for lithography, detecting devices and testing systems. Thus, there is a high demand for structuring and inspecting specimens within the micrometer and nanometer scale.

Micrometer and nanometer scale process control, inspection or structuring is often done with charged particle beams, which are generated and focused in charged particle beam devices. Examples of charged particle beam devices are electron microscopes, electron beam pattern generators, ion microscopes as well as ion beam pattern generators. Charged particle beams, in particular ion beams, offer superior spatial resolution compared to photon beams, due to their short wave lengths at comparable particle energy.

Besides electron microscopes, which include electron sources, microscopes including gas field ion sources for charged particle beam devices are considered. Thereby, for example, an increase in resolution might be realized. However, maintenance of gas field ion source microscopes is, in general, more complicated than maintenance of electron source microscopes.

SUMMARY OF THE INVENTION

In light of the above, the present invention intends to provide an improved gas field ion source, an improved charged particle beam device, an improved method of maintaining a gas field ion source.

The object is solved by a modular gas field ion source as described herein a charged particle device as described herein, as described herein.

According to one embodiment, a gas field ion source is provided. The gas field ion source includes an emitter module. The emitter module includes an emitter holder, an emitter structure, a detachably connectable electrical connection assembly of the emitter module, and a detachably connectable gas supply connection assembly of the emitter module. The gas field ion source further includes a supply module, wherein the supply module includes an electrical conductor for providing voltage and/or current, a gas supply conduit, a thermal conductor, a detachably connectable electrical connection assembly of the supply module, and a detachably connectable gas supply connection assembly of the supply module. The emitter module and the supply module are detachably connectable by the detachably connectable connection assemblies of the emitter module and the detachably connectable connection assemblies of the supply module.

According to a further embodiment, a charged particle beam device is provided. The charged particle beam device includes a gas field ion source. The gas field ion source includes an emitter module. The emitter module includes an emitter holder, an emitter structure, a detachably connectable electrical connection assembly of the emitter module, and a detachably connectable gas supply connection assembly of the emitter module. The gas field ion source further includes a supply module, wherein the supply module includes an electrical conductor for providing voltage and/or current, a gas supply conduit, a thermal conductor, a detachably connectable electrical connection assembly of the supply module, and a detachably connectable gas supply connection assembly of the supply module. The emitter module and the supply module are detachably connectable by the detachably connectable connection assemblies of the emitter module and the detachably connectable connection assemblies of the supply module.

According to a further embodiment, a method of maintaining a charged particle beam device having a gas field ion source with an emitter module and a supply module is provided. The method includes: removing a first emitter module from the charged particle beam device, and placing a second emitter module in the charged particle beam device, wherein during the removing step electrical connections, gas supply connections and thermal conductivity are detached and wherein during the placing step electrical connections, gas supply connections and thermal conductivity are provided.

Further advantages, features, aspects and details that can be combined with the above embodiments are evident from the dependent claims, the description and the drawings.

Embodiments are also directed to apparatuses for carrying out the disclosed methods and including apparatus parts for performing each described method steps. These method steps may be performed by way of hardware components, a computer programmed by appropriate software, by any combination of the two or in any other manner. Furthermore, embodiments are also directed to methods by which the described apparatus operates, is manufacture or is maintained. It includes method steps for carrying out every function of the apparatus, manufacturing every part of the apparatus, or maintaining the apparatus.

BRIEF DESCRIPTION OF THE DRAWINGS

Some of the above indicated and other more detailed aspects of the invention will be described in the following description and partially illustrated with reference to the figures. Therein:

FIG. 1 shows a schematic view of a modular gas field ion source according to embodiments described herein;

FIG. 2 shows a schematic view of another modular gas field ion source according to embodiments described herein;

FIG. 3 shows a schematic view of an even further modular gas field ion source including a suppressor according to embodiments described herein;

FIG. 6 shows a charged particle beam device including a modular gas field ion source according to embodiments described herein.

DETAILED DESCRIPTION OF THE DRAWINGS

Figure 4:
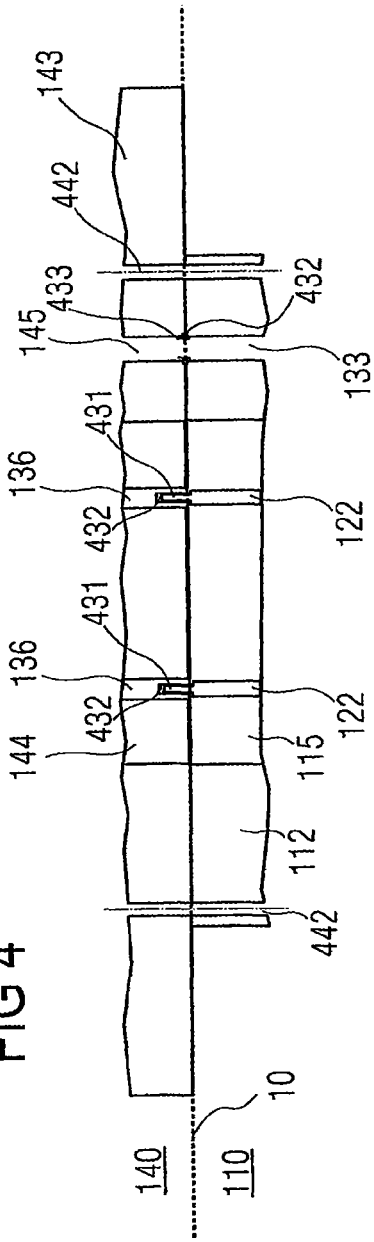
FIG. 4 shows a schematic partial view of a modular gas field ion source according to embodiments described herein.

Without limiting the scope of the present application, in the following the charged particle beam device or components thereof will exemplarily be referred to as an ion beam device or components thereof, which detect secondary and/or backscattered electrons. Thereby, the secondary and/or backscattered electrons might especially be utilized during inspection or lithography. The present invention can still be applied for apparatuses and components using other secondary and/or backscattered charged particles to obtain a specimen image or to control patterning of a specimen.

Within the following description of the drawings, the same reference numbers refer to the same components. Generally, only the differences with respect to the individual embodiments are described.

FIG. 1 illustrates a modular gas field ion source 100. According to embodiments described herein, an emitter module 110 and the supply module 140 are provided. FIG. 1 shows the supply module and the emitter module separated by dashed line 10. Between the emitter module 110 and the supply module 114 a plurality of connections are provided, which are detachably connectable. Thus, the emitter module 110 and the supply module 114 can be provided substantially independent from each other the emitter module is easily replaceable.

Cooling to cryo temperatures, high voltage, heating current and gas can be supplied to the emitter module, whereby a complicated and difficultly structures that are difficult to maintain can be omitted. Thus, the replacement of the emitted tip can be more easily conducted with the modular gas field ion source 100.

As shown in FIG. 1, an easily replaceable emitter module 110 for the gas field ion source 100 is provided according to embodiments described herein. Thereby, an emitter structure includes an emitter 13, e.g., a sharpened single crystal, which is for example made of tungsten, iridium, or the like and which is welded to a supporting wire 12. Further, a base 115 is provided. The supporting wire is fixed to the base 115. According to further embodiments described herein, the base can include a ceramic material.

The emitter module 110 further includes an emitter holder. According to one embodiment, the emitter holder has a cup-like structure, that is, it has, e.g., a circular shape when seen from the top. The emitter holder 112 may, according to further embodiments, surround the emitter tip 13 and has, for example, the purpose of containing the gas for the gas field ion source and supporting the extraction electrode 114. The extraction electrode 114 acts as a counter electrode to the positively biased emitter during operation.

According to an even further embodiment, the extraction voltage can be supplied by conductor 116.

According to one embodiment, as shown in FIG. 1, conductors 122 are embedded in the base 115 and have connections 124, which provide an electrical contact of the conductor 122 within the base 115 and the conductor 126 within the emitter holder 112. Thereby, a high-voltage for the gas field ion source and a heating current can be supplied via the supporting wire 12 to the emitter tip 13.

The emitter holder 12 further includes a gas conduit 113 for providing the gas used for the gas field ion source.

The supply module 140 includes the main body 142. The main body 142 has a first portion 143 and a second portion of 144. Generally, high voltage supply conductors 137 and 136 and a gas conduit 145 are provided.

According to some embodiments, which can be combined with any of the embodiments described herein, the high voltage supply conductors can also be used for providing a heating current to the emitter. According to alternative embodiments, which can also be yielded by a combination with any of of the embodiments described herein, heating current conductors can additionally be provided. According to further embodiments, which can be combined with any of the embodiments described herein, a thermal conductivity between the supply module and the emitter module can be provided via any or all of the electrical conductors or thermal conduction means can additionally or alternatively be provided.

Further, according to one embodiment, the thermal conductor is provided by the second portion 144. According to an even further embodiment, the thermal conductor includes an electrical insulator with a high thermal conductivity, for example, sapphire, or the like. The supply module 140 further includes a cooling unit 146, for example in the form of a cooling finger of the gun head.

Accordingly, according to embodiments described herein, the supply module 140 supplies the functions of cooling, high-voltage, heating current, and gas supply. For example, cooling is provided from the cooling unit 146, e.g. a closed cycle helium-cooler, via the thermal conductor and second portion 144. Further, within the supply module 140, the high-voltage and a heating current are supplied via connectors and/or feedthroughs. The gas, which might be helium, argon or the like can be provided via the conduit 145.

According to further embodiments, two or more conduits, that is gas inlets, can be provided. Thereby, a focused ion beam device further can include an ion beam column including an emitter area for generating ions, a first gas inlet adapted to introduce a first gas to the emitter area, a second gas inlet adapted to introduce a second gas different from the first gas to the emitter area, and a switching unit adapted to switch between introducing the first gas and introducing the second gas. According to other embodiments, a focused ion beam device can be provided, wherein the focused ion beam device includes an ion beam column including an emitter area for generating ions, means for switching between introducing a light gas into the emitter area for an observation mode and introducing a heavy gas into the emitter area for a modification mode, wherein the light gas is selected from the group consisting of hydrogen and helium and the heavy gas has an atomic mass of 10 g/mol or higher. According to yet other embodiments, a method of operating a focused ion beam device can be provided. The method includes biasing an emitter within an emitter area wherein ions are generated, switching between introducing a light gas to the emitter area and a heavy gas to the emitter area, wherein the light gas is selected from the group consisting of hydrogen and helium and the heavy gas has an atomic mass of 10 g/mol or higher. These and other modifications to yield further embodiments are for example disclosed in commonly assigned and co-pending European application No. 06026210.2, filed Dec. 18, 2006, entitled "Gas Field ion source for multiple applications", which is incorporated herein by reference in its entirety for the purpose of describing modification to insert two or more gases, that is respective apparatuses and/or methods.

In order to provide the modular concept and, additionally, an easy separation substantially along the line 10, both the emitter module 110 and the supply module 140 include detachably connectable connections for high-voltage, and gas supply. According to further embodiments, additional connections for cooling and heating current can be provided, particularly in the case that the connections for high-voltage and gas supply do not provide a transfer means for cooling and heating current. In FIG. 1, the electrical connections are indicated by reference numbers 131, the thermal conductor connection is indicated by reference number 133 and the gas supply connection is indicated by reference number 132.

According to other embodiments, the thermal conductor connection can, additionally or alternatively, be provided by the electrical connections.

According to embodiments described herein, the detachably connectable connections are provided at the interface (see, e.g., line 10 in FIGS. 1-4) between the emitter module and the supply module.

According to an even further embodiment, which can be combined with any of the other embodiments described herein, the emitter module and the supply module are adapted to allow a separation between or connection of the modules during which the detachably connectable connections assemblies of the emitter module and the respective once of the supply module are separated or connected, respectively. Accordingly, the gas field ion source allows for an easy separation of the emitter module and the supply module. Thereby, maintenance of the modular gas field ion source can be conducted more easily.

According to one embodiment, the installation of the emitter module, which is to be replaced during regular maintenance, can be done by pressing the detachably connectable electrical connectors of the emitter module into a bushing in the supply module. However, according to further embodiments, connection methods like fixing screws or a concentric screw-nut are also possible. Thereby, all supplies for operating the gas field ion source are connected.

According to embodiments described herein, the emitter structure including the ceramic base 115, the supporting wire 12 and the emitter tip 13 may advantageously be similar to emitters structures used for cold field electron emission (CFE). Thereby, easily available emitter structures, which have previously been used, can be provided for the modular gas field ion source. Maintenance of a modular gas field ion source microscope can, therefore, be made even easier.

The emitter structure can, according to specific embodiments, be fixed to the emitter holder 112 by screws, or the like. Thereby, according to even further embodiments, an alignment of the emitter structure (115, 12, 13) and the emitter holder 112 may optionally be provided.

The emitter module 110 which is formed thereby can be connected to the supply module 140. Thereby, according to embodiments described herein, within one step, electrical connections, gas connections and cooling are provided.

According to an alternative embodiment, which can be combined with other embodiments described herein, loosening of one or more of the connection assemblies or opening of fasteners for one or more of the connection assemblies can additionally be conducted. However, the emitter module can be removed from or are placed at the supply module such that the detachably connectable connections assemblies are connected or at least in position for fastening the connections.

As described above, during maintenance, an emitter module can be removed from the gas field ion source in one piece and a new emitter module can be placed in the gas field ion source in one piece. Thereby, all connections are provided and/or ready for being locked. Further, according to other embodiments, the emitter structure may be placed in the emitter module before the emitter module is placed in the gas field ion source. Thereby, an alignment of the emitter structure and, thereby the emitter can optionally be provided. According to an even further embodiment, the emitter module is provided in an aligned position in the gas field ion source, that is, adjacent to the supply module or can be aligned after connecting the emitter module and the supply module.

FIG. 2 shows another modular gas field ion source 200. Therein, a separation line 10 illustrating a separation for easy maintenance separation of the emitter module 110 and the supply module 140 is shown. According to embodiments described with respect to FIG. 2, the base 115 of the emitter structure extends through the emitter holder 112. Accordingly, the conductors 112, which provide the feedthrough through the base 115, extend substantially to the separation line 10.

Similarly as described with respect to FIG. 1, detachably connectable connections for high voltage, heating current, gas, and cooling of the emitter structure are provided and indicated by reference numerals 131, 132, 133. Similarly to FIG. 1, according to other embodiments, the thermal conductor connection can, additionally or alternatively, be provided by the electrical connections.

The second portion 144 of the main body 142, which provides an electrical insulation and thermal conductivity from the cooling unit 146 to the connection 133 for the thermal conductivity or the electrical connection 131 is provided in a narrow region between the conductors 136. According to different embodiments, the detachably connectable connection for the thermal conductivity can be provided by the electrical connections, flat surfaces, which are in close contact. Additionally or alternatively, thermal grease, heat paste, thermal paste or the like can be provided.

FIG. 2 further shows an emitter holder 112, wherein the emitter holder itself provides the desired diameter for the extraction electrode diaphragm to enable trespassing of the charged particles emitted by the charged particle emitter.

According to one embodiment, as shown in FIG. 2, an electrical connection for providing the extraction voltage is provided by conductor 216, conductor 218, detachably connectable connection 134 and conductor 116.

A further embodiment of a modular gas field ion source 300 is shown in FIG. 3. The detachably connectable connections 133 for the thermal conductivity are, in FIG. 3, provided at several positions in between the connections 131 and outside the connections 131. According to different embodiments, the detachably connectable connection for the thermal conductivity can be provided by flat surfaces, which are in close contact, thermal grease, heat paste, thermal paste or the like.

According to further embodiments, the suppressor 312 is provided. The suppressor 312 is thereby inserted in the cup like structure within the emitter holder 112 of the emitter module 110. Thereby, according to one option, the suppressor might be on the same potential as the emitter tip. The suppressor might, thus, protect the emitter structure including the supporting wire 12, the single crystal emitter tip 12 and the base 115 from arching. Thereby, the electrical field along the supporting wire and the tip can be reduced and remains only at the emitter tip itself.

According to a further option, which might additionally or alternatively be realized, the suppressor structure can be connected via the thermal conductor, for example made out of sapphire, to the detachably connectable connection for the cold supply module and, thus, is held at a low temperature. Thereby, the gas, which is provided along the path of the suppressor to the emitter tip, is cooled to the emitter tip temperature. This might be advantageous as the angular intensity of the gas field ion source can be improved for low temperatures.

Thereby, according to further embodiments, which can be combined with any of the embodiments described herein, the path, which is provided for cooling of the gas is at least provided along 50%, 75% or 90% of the length on one side of the cross-section of the suppressor structure. Thus, the path can be made long to improve the cooling of the gas.

According to different embodiments, the suppressor can, thus, be in electrical communication with the emitter in order to provide the emitter voltage to the suppressor. Alternatively or additionally, the suppressor can be in thermal communication with the detachably connectable thermal conductivity connection assembly of the emitter module in order to conform the suppressor temperature with the emitter temperature.

Similarly to FIG. 1, an easily replaceable emitter module 110 for the gas field ion source is provided according to embodiments described with respect to FIG. 3. Thereby, an emitter structure includes a sharpened single crystal 13, which is for example made of tungsten and which is welded to a supporting wire 12. Further, a base 115 is provided. The supporting wire is fixed to the base 115. According to further embodiments described herein, the base can include a ceramic material.

According to embodiments, as for example shown in FIG. 3, conductors 122 are embedded in the base 115 and have connections 124, which provide an electrical contact of the conductor 122 within the base 115 and the conductor 126 within the emitter holder 112. Thereby, a high-voltage for the gas field ion source and a heating current can be supplied via the supporting wire 12 to the emitter tip 13. The emitter holder 12 further includes a gas conduit 113 for providing the gas used for the gas field ion source.

The supply module 140 includes the main body 142. The main body 142 has a first portion 143 and a second portion of 144. Generally, high voltage supply conductors 137 and 136, heating current conductors (e.g., either in the form of the high-voltage conductors or by additional conductors), a gas conduit 145 and a thermal conductor are provided. Thereby, according to one embodiment, the thermal conductor is provided by the second portion 144. According to an even further embodiment, the thermal conductor includes an electrical insulator with a high thermal conductivity, for example, sapphire. The supply module 140 further includes a cooling unit 146, for example in the form of a cooling finger of the gun head. According to yet another embodiment, which might be combined with any of the embodiments described herein, the cooling unit can be a closed or open cycle He-cooler, which cools by using He, liquid He and liquid N2 or other cooling units like Accordingly, according to embodiments described herein, the supply module 140 supplies the functions of cooling, high-voltage, heating current, and gas supply. In order to provide the modular concept and, additionally, an easy separation substantially along the line 10, each of the emitter module 110 and the supply module 140 include detachably connectable connections for cooling (e.g., by electrical connections and/or additional surfaces), high-voltage, heating current (e.g., by the electrical connections for high-voltage or separate electrical connections), and gas supply. In FIG. 3, the electrical connections are indicated by reference numbers 131, the additional thermal conductor connection is indicated by reference number 133 and the gas supply connection is indicated by reference number 132.

According to embodiments described herein, the detachably connectable connections allow for an easy separation of the emitter module and the supply module. Thereby, maintenance of the modular gas field ion source can be conducted more easily.

According to an even further embodiment, which can be combined with any of the other embodiments described herein, the emitter module and the supply module are adapted to allow a separation between or connection of the modules during which the detachably connectable connections assemblies of the emitter module and the respective once of the supply module are separated or connected, respectively. Accordingly, the gas field ion source allows for an easy separation of the emitter module and the supply module. Thereby, maintenance of the modular gas field ion source can be conducted more easily.

According to a yet alternative embodiment, which can be combined with other embodiments described herein, loosening of one or more the connection assemblies or opening of fasteners for one or more of the connection assemblies can additionally be conducted. However, the emitter module can be removed from or are placed at the supply module such that the detachably connectable connections assemblies are connected or at least in position for fastening the connections.

For example, the installation of the emitter module, which is to be replaced during regular maintenance, can be done by pressing the detachably connectable electrical connectors of the emitter module into a bushing in the supply module. However, according to further embodiments, connection methods like fixing screws or a concentric screw-nut are also possible. Thereby, all supplies for operating the gas field ion source are connected.

According to embodiments described herein, the emitter structure including the ceramic base 115, the supporting wire 12 and the emitter tip 13 may advantageously be similar to emitters structures used for cold field electron emission (CFE). Thereby, easily available emitter structures, which have previously been used, can be provided for the modular gas field ion source. Maintenance of a modular gas field ion source microscope can be made even easier.

The emitter structure can, according to specific embodiments, be fixed to the emitter holder 112 by screws, or the like. Thereby, according to even further embodiments, an alignment of the emitter structure (115, 12, 13) and the emitter holder 112 may optionally be provided.

In FIG. 3, similarly to the embodiments described with respect to FIG. 1, the extraction voltage for the extractor 114 is provided by conductor 116. However, according to a further embodiment, the conductor 116 is connected to the emitter holder 112. Thereby, the emitter holder 112 is in electrical connection with the extraction electrode in order to provide the extraction voltage to the extraction electrode 114.

According to different embodiments, the conductor 116 can be provided to automatically connect to the emitter holder when attaching the emitter module 110 to the supply module 114. This can for example be provided by a spring contact or another metal part that is coupled to the emitter holder 112 when the emitter holder 112 is placed into the desired position.

A more detailed view of the portion of the modular gas field ion source at which the emitter module 110 is detachably connected to the supply module 140 is shown in FIG. 4. In FIG. 4, the electrical connections for the high voltage and a heating current are shown by the connection between conductors or feedthroughs 122 and 136. Thereby, feedthrough 136 has a socket 432. The plug 431 of the feedthrough 122 connects with the socket 432 when the emitter module 110 is connected to the supply module 140. The gas supply conduits 133 and 145 also connected essentially at dashed line 10. Thereby, the protrusion 433 of the conduit 133, which is inserted in the conduit 145 of the supply module, provides a gas connection. The O-ring 432 seals the gas supply conduits.

The detachably connected connections for the thermal conductivity between the portion 144 of the supply module and the base 115 of the emitter structure of the emitter module 110 is provided by portions 433, which can optionally be provided with a thermal grease, heat paste or the like. According to even further embodiments, the thermal conductivity can alternatively or additionally be provided via the electrical connections.

According to embodiments described herein, as shown in FIG. 4, holes 442 are provided in the supply module 140 and the emitter module 110 such that the supply module and the emitter module can be connected with a screw connection, a pin connection for alignment, or the like. This connection can be combined with other embodiments described herein, whereby further embodiments can be yielded. However, other connections between the supply module 140 and the emitter module 110 can also be provided.

Figure 5:
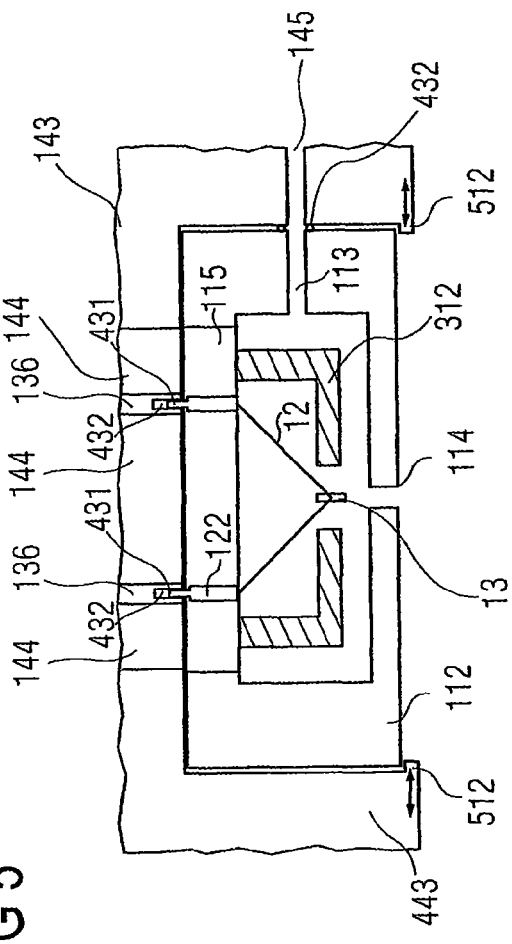
FIG. 5 shows a schematic partial view of another modular gas field ion source according to embodiments described herein.

FIG. 5 illustrates further embodiments of a detachable connection between a supply module and an emitter module. According to these embodiments, which can be combined with other embodiments described herein, the portion 143 of the supply module has leg portions 443 which include protrusions 512. The leg portions 443 and, thereby, the protrusions 512 can be slightly bent outward, so that the emitter holder 112 can be clicked from the bottom into the connecting positions. The protrusions 512 which form a holding clip for the emitter holder 112 allow a detachable connection of the emitter module and the supply module.

According to further embodiments, the gas conduits 133 and 145 are provided at a side portion of the emitter holder 112 and the main body of the supply module. When the emitter module is clicked into position in the supply module, an O-ring 432 seals the gas supply connection.

According to further embodiments, it is possible that on the sides of the emitter holder 112, that is, in the gaps between the supply module and the emitter module, alignment elements are provided. The gap shown in FIG. 5 is for illustrating purposes only. An alignment of the emitter module with respect to the support module can provide an exact alignment.

In FIG. 5, the electrical connections for the high voltage and a heating current are shown by the connection between conductors or feedthroughs 122 and 136. Thereby, feedthrough 136 has a socket 432. The plug 431 of the feedthrough 122 connects with the socket 432 when the emitter module 110 is connected to the supply module 140.

The detachably connected connections for the thermal conductivity between the portion 144 of the supply module and the base 115 of the emitter structure of the emitter module 110 is provided by portions 433, which can optionally be provided with a thermal grease, heat paste or the like. According to even further embodiments, the thermal conductivity can alternatively or additionally be provided via the electrical connections.

According to different embodiments, which might be combined with other embodiments described herein, a modular gas field ion source is provided with an emitter module and a supply module such that the detachably connectable electrical connections assembly of the emitter module and the detachably connectable electrical connections assembly of the supply module provide a plug-socket connection. Thereby, according to further embodiments, the electrical connection assembly can include at least one of the following electrical connections selected from the group of: high voltage supply for the emitter, heating current supply for the emitter, extraction voltage supply and combinations thereof.

According to even further embodiments, which might be combined with embodiments described herein, the detachably connectable gas supply connection assembly of the emitter module and/or the detachably connectable gas supply connection assembly of the supply module include an O-ring. Further, the detachably connectable thermal conductivity connection assembly of the emitter module and the detachably connectable thermal conductivity connection assembly of the supply module can optionally include a thermal grease, a heat paste or the like; or can be provided via the electrical connections.

According to other embodiments, the emitter holder includes an extraction electrode portion adapted for providing an extraction electrode, e.g., includes a holding portion for an extraction electrode or forms the extraction electrode. According to further embodiments, the conductor for the extraction voltage can include a connection mechanism adapted for automatically connecting to the emitter module during connecting the emitter module with the supply module. This can be realized by a contact external of the supply module or such that the detachably connectable electrical connection assembly of the emitter module includes a detachably connectable electrical connection for the extraction voltage and the detachably connectable electrical connection assembly of the supply module includes a detachably connectable electrical connection for the extraction voltage.

According to yet further embodiments, feedthroughs in the base 115 from the supporting wire to the connections between the emitter module and the supply module can be provided such that the detachably connectable electrical connection assembly of the emitter module, the detachably connectable gas supply connection assembly of the emitter module, and the detachably connectable thermal conductivity connection assembly, which can additionally or alternatively be provided by the electrical connection assembly, of the emitter module are integrated in the emitter structure. Alternatively, the detachably connectable gas supply connection assembly of the emitter module, and the detachably connectable thermal conductivity connection assembly, which can additionally or alternatively be provided by the electrical connection assembly, of the emitter module are integrated in the emitter holder.

Generally for the embodiment described herein, the emitter module and the supply module are adapted to allow a separation between or connection of the modules during which the detachably connectable connections assemblies of the emitter module and the respective once of the supply module are separated or connected, respectively. Accordingly, the gas field ion source allows for an easy separation of the emitter module and the supply module. Thereby, maintenance of the modular gas field ion source can be conducted more easily.

According to a yet alternative embodiment, which can be combined with other embodiments described herein, loosening of one or more of the connection assemblies or opening of fasteners for one or more of the connection assemblies can additionally be conducted. However, the emitter module can be removed from or are placed at the supply module such that the detachably connectable connections assemblies are connected or at least in position for fastening the connections.

FIG. 6 shows a charged particle beam device 600. The ion beam device includes a column 20. Therein a modular gas field ion source 100 according to any of the embodiments described herein can be provided. The primary beam is emitted essentially along optical axis 2. The gun chamber housing 21 is separated by aperture 33 from the following chamber 22. The primary ion beam is formed and guided by condenser lens 42.

The primary ion beam passes through the opening 12 in detector 40 and is focused by objective lens 30.

According to one embodiment, a gas field ion source is provided. The gas field ion source includes an emitter module. The emitter module includes an emitter holder; an emitter structure; a detachably connectable electrical connection assembly of the emitter module; and a detachably connectable gas supply connection assembly of the emitter module. The gas field ion source further includes a supply module. The supply module includes at least one electrical conductor for providing voltage and/or current; a gas supply conduit; a thermal conductor; a detachably connectable electrical connection assembly of the supply module; and a detachably connectable gas supply connection assembly of the supply module; wherein the emitter module and the supply module are detachably connectable by the detachably connectable connection assemblies of the emitter module and the detachably connectable connection assemblies of the supply module.

According to further optional implementations the emitter module can further include a detachably connectable thermal conductivity connection assembly of the emitter module; and the supply module can further includes a detachably connectable thermal conductivity connection assembly of the supply module. According to yet further embodiments, which can be combined with any of the embodiments, described herein, the detachably connectable electrical connections assembly of the emitter module and the detachably connectable electrical connections assembly of the supply module can provide a plug-socket connection; the detachably connectable gas supply connection assembly of the emitter module and the detachably connectable gas supply connection assembly of the supply module can include an O-ring; the detachably connectable thermal conductivity connection assembly of the emitter module and the detachably connectable thermal conductivity connection assembly of the supply module can include a thermal grease, a heat paste or the like; and/or the emitter structure can include a base, a supporting wire connected to the base, and an emitter tip connected to the supporting wire.

According to yet further embodiments, which can be combined with other embodiments described herein, the thermal conductor of the supply module can be adapted to connect a cooling unit with the detachably connectable thermal conductivity connection assembly of the supply module; the thermal conductor of the supply module can include an electrical insulator, e.g., the thermal conductor of the supply module can include sapphire, or the like; and/or the emitter holder can include an extraction electrode portion adapted for providing an extraction electrode. Thereby, as further additional or alternative modifications, the emitter holder can form the extraction electrode; and the gas field ion source can further include an extraction voltage electrical conductor, wherein the extraction voltage electrical conductor provides a voltage to the extraction electrode.

According to yet further optional implementations the extraction voltage electrical conductor can include a connection mechanism adapted for connecting to the emitter module during connecting the emitter module with the supply module; the detachably connectable electrical connection assembly of the emitter module can include a detachably connectable electrical connection for the extraction voltage and the detachably connectable electrical connection assembly of the supply module can include a detachably connectable electrical connection for the extraction voltage.

According to yet further embodiments, additionally or alternatively, the emitter module can further include a suppressor located to be within the emitter holder, such that, for example, the suppressor can be in electrical communication with the emitter in order to provide the emitter voltage to the suppressor and/or the suppressor can be in thermal communication with the detachably connectable thermal conductivity connection assembly of the emitter module in order to conform the suppressor temperature with the emitter temperature.

According to yet further embodiments, yet further optional modifications can be provided as follows: the detachably connectable electrical connection assembly of the emitter module and the detachably connectable gas supply connection assembly of the emitter module, can be integrated in the emitter structure; and/or the detachably connectable electrical connection assembly of the emitter module and the detachably connectable gas supply connection assembly of the emitter module can be integrated in the emitter holder.

According to other embodiments a charged particle beam device is provided, wherein the charged particle beam device includes a gas field ion source according to any of the embodiments described herein.

According to yet other embodiments, a method of maintaining a charged particle beam device having a gas field ion source with an emitter module and a supply module is provided. The method includes removing a first emitter module from the charged particle beam device; and placing a second emitter module in the charged particle beam device; wherein during the removing step electrical connections, gas supply connections and thermal conductivity are detached and wherein during the placing step electrical connections, gas supply connections and thermal conductivity are provided.

According to further embodiments, which can be combined with other embodiments described herein, the method can further include aligning the emitter module and the supply module; placing an emitter structure having a base, a supporting wire and an emitter tip in an emitter holder of the emitter structure; and/or aligning the emitter structure and the emitter holder.

While the foregoing is directed to embodiments of the invention, other and further embodiments of the invention may be devised without departing from the basic scope thereof, and the scope thereof is determined by the claims that follow.

The invention claimed is:
1. A gas field ion source, comprising:
an emitter module, comprising:
  an emitter holder;
  an emitter structure;
  a detachably connectable electrical connection assembly of the emitter module; and
  a detachably connectable gas supply connection assembly of the emitter module;
the gas field ion source further comprises a supply module, the supply module comprising:
  at least one electrical conductor for providing voltage and/or current;
  a gas supply conduit;
  a thermal conductor;
  a detachably connectable electrical connection assembly of the supply module; and
  a detachably connectable gas supply connection assembly of the supply module;
wherein the emitter module and the supply module are detachably connectable by the detachably connectable connection assemblies of the emitter module and the detachably connectable connection assemblies of the supply module, wherein the detachably connectable connection assemblies are provided at a flat interface between the emitter module and the supply module, wherein the detachably connectable electrical connection assembly of the emitter module and the detachably connectable electrical connection assembly of the supply module provide a plug-socket connection at said flat interface.

2. The gas field ion source according to claim 1, wherein the emitter module further comprises:
a detachably connectable thermal conductivity connection assembly of the emitter module; and
wherein the supply module further comprises:
a detachably connectable thermal conductivity connection assembly of the supply module.

3. The gas field ion source according to claim 1, wherein the detachably connectable gas supply connection assembly of the emitter module and the detachably connectable gas supply connection assembly of the supply module comprise an O-ring.

4. The gas field ion source according to claim 2, wherein the detachably connectable thermal conductivity connection assembly of the emitter module and the detachably connectable thermal conductivity connection assembly of the supply module comprise a thermal grease or a heat paste.

5. The gas field ion source according to claim 1, wherein the emitter structure comprises:
a base;
a supporting wire connected to the base; and
an emitter tip connected to the supporting wire.

6. The gas field ion source according to claim 2, wherein the thermal conductor of the supply module is adapted to connect a cooling unit with the detachably connectable thermal conductivity connection assembly of the supply module.

7. The gas field ion source according to claim 1, wherein the thermal conductor of the supply module is an electrical insulator.

8. The gas field ion source according to claim 6, wherein the thermal conductor of the supply module comprises sapphire.

9. The gas field ion source according to claim 1, wherein the emitter holder includes an extraction electrode portion adapted for providing an extraction electrode.

10. The gas field ion source according to claim 9, wherein the emitter holder forms the extraction electrode.

11. The gas field ion source according to claim 9, further comprising:
an extraction voltage electrical conductor, wherein the extraction voltage electrical conductor provides a voltage to the extraction electrode.

12. The gas field ion source according to claim 11, wherein the extraction voltage electrical conductor includes a connection mechanism adapted for connecting to the emitter module during connecting the emitter module with the supply module.

13. The gas field ion source according to claim 12, wherein the detachably connectable electrical connection assembly of the emitter module comprises a detachably connectable electrical connection for the extraction voltage and the detachably connectable electrical connection assembly of the supply module comprises a detachably connectable electrical connection for the extraction voltage.

14. The gas field ion source according to claim 1, wherein the emitter module further comprises:
a suppressor located to be within the emitter holder.

15. The gas field ion source according to claim 14, wherein the suppressor is in electrical communication with the emitter in order to provide the emitter voltage to the suppressor.

16. The gas field ion source according to claim 14, wherein the suppressor is in thermal communication with the detachably connectable thermal conductivity connection assembly of the emitter module in order to conform the suppressor temperature with the emitter temperature.

17. The gas field ion source according to claim 14, wherein the detachably connectable electrical connection assembly of the emitter module and the detachably connectable gas supply connection assembly of the emitter module are integrated in the emitter structure.

18. The gas field ion source according to claim 1, wherein the detachably connectable electrical connection assembly of the emitter module and the detachably connectable gas supply connection assembly of the emitter module are integrated in the emitter structure.

19. A charged particle beam device, comprising:
a gas field ion source according to claim 1.

* * * * *

UNITED STATES PATENT AND TRADEMARK OFFICE
CERTIFICATE OF CORRECTION

PATENT NO. : 8,101,922 B2  Page 1 of 1
APPLICATION NO. : 12/167734
DATED : January 24, 2012
INVENTOR(S) : Winkler et al.

It is certified that error appears in the above-identified patent and that said Letters Patent is hereby corrected as shown below:

In the Summary of the Invention:

Column 1, Lines 45-47, please delete "The object is solved by a modular gas field ion source as described herein a charged particle device as described herein, as described herein." and insert --The object is solved by a modular gas field ion source as described herein, a charged particle device as described herein, and by the method for maintaining of a gas field ion source as described herein.-- therefor.

Signed and Sealed this
Tenth Day of April, 2012

David J. Kappos
*Director of the United States Patent and Trademark Office*